(12) United States Patent
Meyer et al.

(10) Patent No.: US 11,564,307 B2
(45) Date of Patent: Jan. 24, 2023

(54) CARRIER SUBSTRATE WITH A THICK METAL INTERLAYER AND A COOLING STRUCTURE

(71) Applicant: Rogers Germany GmbH, Eschenbach (DE)

(72) Inventors: Andreas Meyer, Wenzenbach (DE); Vitalij Gil, Hersbruck (DE); László Müller, Nuremberg (DE); Rainer Herrmann, Warmensteinach (DE); Stefan Britting, Schnaittach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 64 days.

(21) Appl. No.: 16/472,547

(22) PCT Filed: Dec. 19, 2017

(86) PCT No.: PCT/EP2017/083434
§ 371 (c)(1),
(2) Date: Jun. 21, 2019

(87) PCT Pub. No.: WO2018/114880
PCT Pub. Date: Jun. 28, 2018

(65) Prior Publication Data
US 2021/0084748 A1    Mar. 18, 2021

(30) Foreign Application Priority Data
Dec. 22, 2016    (DE) .......................... 102016125348.0

(51) Int. Cl.
*H05K 1/02* (2006.01)
*H01L 23/373* (2006.01)
*H05K 1/05* (2006.01)

(52) U.S. Cl.
CPC ....... *H05K 1/0206* (2013.01); *H01L 23/3731* (2013.01); *H01L 23/3735* (2013.01); *H05K 1/0271* (2013.01); *H05K 1/053* (2013.01)

(58) Field of Classification Search
CPC ..... H05K 1/0203–0206; H05K 1/0209; H05K 1/053; H01L 23/3731; H01L 23/3735; H01L 23/3736
See application file for complete search history.

(56) References Cited

U.S. PATENT DOCUMENTS 4,365,168 A * 12/1982 Chaput ................. H05K 1/162
307/115
4,383,270 A * 5/1983 Schelhorn ............. H01L 23/142
257/E23.101
(Continued)

FOREIGN PATENT DOCUMENTS

CN        202652683 U        1/2013
DE        3930858 A1 *       3/1990 ............. H05K 1/021
(Continued)

OTHER PUBLICATIONS

International Search Report and Written Opinion with English Translation, for International Application No. PCT/EP2017/083434, International Filing Date Dec. 19, 2017, dated Apr. 4, 2018, 13 pages.
(Continued)

*Primary Examiner* — Robert J Hoffberg
(74) *Attorney, Agent, or Firm* — Cantor Colburn LLP (57) ABSTRACT

The present invention proposes a carrier substrate (1) for electrical components (13), the carrier substrate (1) having a component side (4) and a cooling side (5) which is opposite the component side (4) and has a cooling structure (30), the carrier substrate (1) comprising a primary layer (10) which faces the component side (4) and is produced from ceramic for electrical insulation, and a secondary layer
(Continued)

(20) which faces the cooling side (5) for stiffening the carrier substrate (1), characterized in that a metallic intermediate layer (15) is arranged between the primary layer (10) and the secondary layer (20) for heat transfer from the component side (4) to the cooling side (5), the metallic intermediate layer (15) being thicker than the primary layer (10) and/or the secondary layer (20).

13 Claims, 6 Drawing Sheets

(56) References Cited

U.S. PATENT DOCUMENTS

| | | | | |
|---|---|---|---|---|
| 4,997,698 | A | * | 3/1991 | Oboodi ............... C03C 10/0045 257/E23.009 |
| 5,073,840 | A | * | 12/1991 | Coors ..................... H05K 3/44 361/760 |
| 5,565,262 | A | * | 10/1996 | Azzaro ................ H01L 21/486 428/210 |
| 5,581,876 | A | * | 12/1996 | Prabhu ..................... C03C 8/04 29/851 |
| 5,689,404 | A | * | 11/1997 | Katsui .................. H01L 23/467 257/E23.105 |
| 5,786,986 | A | * | 7/1998 | Bregman ............ H01L 23/5385 174/252 |
| 5,990,548 | A | * | 11/1999 | Kobayashi .......... H01L 23/3736 257/E23.109 |
| 6,605,868 | B2 | * | 8/2003 | Ishiwata ............. H05K 1/0256 29/827 |
| 6,831,835 | B2 | * | 12/2004 | Soto ....................... H05K 7/209 174/252 |
| 7,183,640 | B2 | * | 2/2007 | Mazzochette ....... H01L 23/3677 257/703 |
| 7,263,766 | B2 | * | 9/2007 | Ishiwata ............. H05K 1/0256 29/829 |
| 7,355,853 | B2 | * | 4/2008 | Emoto .................. H01L 23/367 165/185 |
| 8,198,139 | B2 | * | 6/2012 | Yang ................ H01L 23/49575 438/123 |
| 8,710,514 | B2 | * | 4/2014 | Andrews .............. H01L 33/642 257/81 |
| 9,233,438 | B2 | * | 1/2016 | Phelan ...................... F28F 3/02 |
| 9,615,442 | B2 | * | 4/2017 | Oi ........................ H05K 1/0271 |
| 9,655,294 | B2 | * | 5/2017 | Loong ..................... H05K 13/00 |
| 9,681,580 | B2 | * | 6/2017 | Loong ................. H01L 21/4878 |
| 10,037,928 | B2 | * | 7/2018 | Ogawa ................. H01L 23/367 |
| 10,068,829 | B2 | * | 9/2018 | Oi .......................... C04B 37/026 |
| 10,453,772 | B2 | * | 10/2019 | Oohiraki ............. H01L 21/4882 |
| 2002/0001177 | A1 | | 1/2002 | Petitbon |
| 2005/0122018 | A1 | | 6/2005 | Morris |
| 2009/0141456 | A1 | * | 6/2009 | Juett .................... H01L 23/5385 361/721 |
| 2010/0065962 | A1 | | 3/2010 | Bayerer et al. |
| 2012/0026692 | A1 | * | 2/2012 | Loong ................. H01L 21/4878 361/702 |
| 2012/0199381 | A1 | | 8/2012 | Heo et al. |
| 2013/0175019 | A1 | * | 7/2013 | Phelan .................. H01L 23/427 165/185 |
| 2015/0223317 | A1 | | 8/2015 | Oi |
| 2016/0014878 | A1 | * | 1/2016 | Kilhenny ............. H05K 3/0094 257/99 |
| 2016/0081178 | A1 | | 3/2016 | Donofrio |

FOREIGN PATENT DOCUMENTS

| | | | |
|---|---|---|---|
| DE | 4004844 | C1 | 1/1991 |
| DE | 102010049499 | A1 | 5/2012 |
| DE | 102012206276 | A1 | 11/2012 |
| EP | 2892074 | A1 | 7/2015 |
| EP | 3252810 | A1 | 12/2017 |
| JP | S59208892 | A * | 11/1984 |
| JP | H10258479 | * | 9/1998 |
| JP | 2000294721 | A * | 10/2000 |
| JP | 2000332170 | A * | 11/2000 |
| JP | 3145748 | 32 | 3/2001 |
| JP | 2005026252 | A | 1/2005 |
| JP | 2006310363 | A | 11/2006 |
| JP | 2007281498 | A | 10/2007 |
| JP | 2008270294 | A | 11/2008 |
| JP | 2013016690 | | 1/2013 |
| WO | 20080785409 | A1 | 6/2008 |
| WO | WO-2015163453 | A1 * | 10/2015 ......... H01L 23/3731 |
| WO | WO-2016121660 | A1 * | 8/2016 ............ H01L 23/36 |

OTHER PUBLICATIONS

IPRP Report dated Jul. 5, 2019 for International Application No. PCT/EP2017/083434; international Filing Date Dec. 19, 2017, 8 pages.

* cited by examiner

CARRIER SUBSTRATE WITH A THICK METAL INTERLAYER AND A COOLING STRUCTURE

CROSS REFERENCE TO RELATED APPLICATIONS

This application is a National Stage application of PCT/EP2017/083434, filed Dec. 19, 2017, which claims the benefit of German Application No. 102016125348.0, filed Dec. 22, 2016, both of which are incorporated by reference in their entirety herein.

BACKGROUND

The present invention concerns a carrier substrate for electrical components, in particular electronic components, and a process for producing a carrier substrate.

Carrier substrates, for example, are known as boards or printed circuit boards from DE 10 2004 033 933 A1. Typically, electrical components and conductive paths are arranged on one component side of the carrier substrate, wherein the electrical components and conductive paths can be interconnected to form electrical circuits. For special applications, carrier substrates have proven to be particularly advantageous which have an insulating layer with high electrical insulation strength for the electrical insulation of the individual electrical components and conductive paths, e.g. a primary layer produced from ceramic.

During operation of these carrier substrates, the electrical components are typically stressed in such a way that they heat up and form local heat sources on the component side. In order to avoid damage to the electrical components or the carrier substrate caused by heating, the state of the art therefore knows, for example, from DE 10 2009 022 877 A1, heat sinks or cooling structures that are usually soldered to a cooling side opposite the component side, which is formed, for example, as a copper layer or copper base adjacent to the primary layer. In order to provide sufficient heat capacity by the heat sink or the cooling structure, the heat sinks and/or the cooling structures must be dimensioned appropriately large, which means that a design for the carrier substrate that fills an available space cannot be avoided in a disadvantageous way.

In addition, certain electrical components and their power density increase demands on the cooling performance of the carrier substrate. Further, parasitic inductances can occur on the carrier substrate when the electrical components are used, which have a negative effect on the operation of the carrier substrate. Finally, the electromagnetic compatibility of such carrier substrates have high demands on the conductor structures used or the metallic structures in general.

SUMMARY

It is therefore an object of the present invention to improve carrier substrates with a primary layer (for example produced from) ceramics, especially with regard to size, weight, cooling performance, electromagnetic compatibility and parasitic inductances.

This problem is solved by a carrier substrate for electrical components disclosed herein and a method disclosed herein. Further advantages and features of the invention result from the dependent claims as from well as the description and the attached figures.

BRIEF DESCRIPTION OF THE DRAWINGS

Further advantages and characteristics result from the following description of preferred forms of execution of the object of the invention with reference to the attached figures, where the figures show.

DETAILED DESCRIPTION

In accordance with the invention, a carrier substrate is provided for electrical components, in particular electronic components, the carrier substrate having a component side and a cooling side which is opposite the component side and has a cooling structure, the carrier substrate, for electrical insulation has a primary layer which faces the component side and is in particular produced from a ceramic, for example, $Al_2O_3$, $Si_3N_4$, AlN or HPSX ceramic (i.e. of a ceramic having an $Al_2O_3$ matrix which comprises an x-percent proportion of $ZrO_2$, for example $Al_2O_3$ with 9% $ZrO_2$=$HPS_9$ or $Al_2O_3$ with 25% $ZrO_2$=$HPS_{25}$), and, for stiffening the carrier substrate, has a secondary layer facing the cooling side, a metallic intermediate layer being arranged between the primary layer and the secondary layer for heat transfer from the component side to the cooling side, the metallic intermediate layer being thicker than the primary layer and/or the secondary layer.

The primary layer has an insulation layer with high electrical insulation resistance, preferably of more than 5 kV/mm, particularly preferred of more than 10, 20 or even more than 30 kV/mm and/or with high thermal conductivity, preferably of more than 10 W/mK, particularly preferred of more than 20 W/mK or even more than 60 W/mK, such as technical ceramics or organic insulation materials filled with thermally conductive materials. The thickness of the primary and/or secondary layer is preferably designed or selected to meet the requirements for dielectric strength or electrical strength. It has been shown that in the majority of applications this requires a thickness of the primary layer and/or the secondary layer of 0.1-0.4 mm from the ceramic materials already mentioned. In case of such carrier substrates, which, for example, require a dielectric strength of 10-15 kV with new SiC-based semiconductor components for high-voltage DC transmission, layer thicknesses of up to 2 mm and more are required for the primary layer and/or the secondary layer.

In contrast to the state of the art, the carrier substrate is provided in a sandwich construction in which the primary layer and the secondary layer are separated by the metallic intermediate layer. The intermediate layer allows the heat flow from the local heat source to spread better in the direction of the secondary layer or the cooling side and to ensure a more extensive heat distribution on the cooling side, which forms the critical heat transfer surface for discharging the heat. This improves the static thermal resistance (RTH) of the entire carrier substrate, i.e. the thermal resistance that occurs during stationary operation of the carrier substrate. For example, the static thermal resistance can be improved by up to 30% in this way. As a result, an oversized cooling structure on the cooling side of the carrier substrate, which would otherwise comprise a 3 mm to 5 mm thick base plate, can be dispensed with. This not only leads to the advantage that material can be dispensed with and thus the manufacturing costs can be reduced, but also allows the carrier substrate to be designed symmetrically—particularly with regard to a metal coating on the component side as well as on the cooling side—which can counteract thermally induced mechanical stresses or a mechanical prying effect during operation. Otherwise, such mechanical stresses—for example in the form of a bimetal effect—and especially when thick cooling structures are used, can lead to bending of the carrier substrate.

In addition, the intermediate layer ensures that the transient or dynamic thermal resistance (ZTH) is sufficiently dimensioned, since the intermediate layer can absorb or store the heat for a short time during switch-on processes or power peaks. It should be taken into account that the carrier substrate is preferably designed with regard to its static thermal resistance. Here, the static thermal resistance preferably starts after approx. 20 to 30 s and can be measured advantageously on the component. To compare the dynamic behavior of different systems, it is also conceivable to measure the thermal resistance 300 ms after the start of the switch-on process.

Furthermore, it proves to be advantageous that the comparatively thick intermediate layer contributes to the stiffening or stabilisation of the entire carrier substrate. The carrier substrate turned out to be sufficiently stiff, especially with respect to internal stresses and external forces, such as those acting on the carrier substrate by the cooling liquid. Furthermore, the layer thickness of the ceramic layers can be reduced in an advantageous way.

According to a preferred form of the present invention, it is provided that the intermediate layer is between 1.1 and 10 times, preferably between 1.2 and 5 times, more preferably between 1.3 and 3 times or even substantially 1.5 times as thick as the primary layer and/or the secondary layer. However, the intermediate layer can also have other thicknesses. In particular, the intermediate layer is between 1 mm and 10 mm, preferably between 1 mm and 5 mm, more preferably between 1.5 mm and 5 mm or even essentially 1.5 mm thick. It has been shown in a surprising way that the static thermal resistance outside these value ranges, i.e. both with increasing and decreasing interlayer thickness, particularly with respect to the thicknesses of the primary layer and/or the secondary layer, deteriorates. Accordingly, it is advantageous to adjust the interlayer thickness correspondingly in order to optimize the cooling performance.

According to a preferred form of the present invention, the intermediate layer is intended to be between 2.5 and 100 times, preferably between 3.5 and 50 times, more preferably between 10 and 25 times or even substantially 20 times as thick as the primary layer and/or the secondary layer. However, the intermediate layer can also have other thicknesses. In particular, the intermediate layer is between 1 mm and 10 mm, preferably between 1 mm and 5 mm, particularly preferred between 1.5 mm and 5 mm or even essentially 3 mm thick. Such thick intermediate layers allow an optimal heat spread in the intermediate layer, wherein the transported heat is distributed as homogenously as possible in an advantageous way before it is dissipated via the cooling structure.

According to another version of the present invention, it is provided that the intermediate layer is thicker than 1 mm, preferably thicker than 1.4 mm and more preferably thicker than 1.9 mm. These comparatively thick intermediate layers prove to be advantageous for heat spreading, especially for a majority of different substrate types. It is advantageous to make the intermediate layers such thick that the cooling structure on the cooling side can again be deranged smaller in size. It is even conceivable that, despite the increase in the interlayer thickness, the cooling structure can be dimensioned smaller so that an overall thickness of the carrier substrate can be reduced.

It is preferably provided that the cooling structure has a base body region and a rip region, wherein a ratio (SD/BD) between a rip region thickness and a base body thickness assumes a value between 1.2 to 6, preferably between 1.4 and 3 and more preferably between 1.6 and 2.5. With a comparable cooling power, it has been shown to be advantageous that the rip regions, i.e. the fins of a heat sink for example, can be dimensioned significantly shorter. The result is a more compact design of the carrier substrate and optimised flow conditions. The ratio between 1.6 and 2.5 has proven to be particularly advantageous, as it allows both an improved cooling effect and a comparatively compact design of the carrier substrate to be achieved. The rip region is preferably formed by rips or fins projecting vertically from the base body region, while the base body region in particular forms a solid or massive region. It is also conceivable that the rips are inclined in relation to a vertical alignment to the base body region. In particular, the rip region thickness and the base body thickness are measured in a direction perpendicular to the main extension plane.

Preferably a cooling structure thickness, in particular an effective cooling structure thickness, is 0.03 to 1 times, preferably 0.1 to 0.5 and more preferably 0.15 to 0.3 times as large as the metallic intermediate layer. Surprisingly, it has been shown that such thin cooling structure thicknesses can be realized. In addition to reducing the overall thickness, it is advantageously possible to dimension the cooling structure thicknesses so that they have a thickness, in particular an effective cooling structure thickness, which is comparable to the thickness of a metallization on the opposite component side. The effective cooling structure thickness takes into account the fact that the cooling structure is not flat but structured, i.e. a thickness equivalent of the structured cooling structure is assumed to a non-structured heat sink.

Basically, the primary layer, which is produced from ceramic in particular, is flat and plate-shaped and preferably extends over the entire component side of the carrier substrate, wherein the secondary layer is aligned parallel to the primary layer in particular. On the component side, more specifically on the side of the primary layer facing away from the intermediate layer, metallic connecting elements and in particular conductive paths are arranged, which are preferably provided for controlling electrical components which are attached to the connecting elements and are electrically conductively connected to the metallic connecting elements. Furthermore, according to an embodiment of the invention, it is provided that the cooling structure on the cooling side directly adjoins the secondary layer, i.e. there is no solder metal or similar between the cooling structure and the secondary layer, with the exception of the solder metals, which enable a direct connection of the cooler with the secondary layer, for example by an active soldering process or a DCB process. Furthermore, a part of the cooling structure extending parallel to the primary layer and immediately adjacent to the secondary layer is thinner than the metallic intermediate layer. Layer thickness means the extent of the respective layer, i.e. the intermediate layer, the primary layer and the secondary layer, extending perpendicularly to the main extension plane of the primary layer, wherein the primary layer, the intermediate layer and the secondary layer are stacked or arranged one above the other, in particular along the direction extending perpendicularly to the main extension plane of the primary layer.

Furthermore, it is conceivable that the intermediate layer is multi-layered. In this case, the carrier substrate can be produced by joining together an upper multilayer layer having at least three layers, consisting of a conductive path (possibly equipped with components), primary layer and first layer of the intermediate layer and a lower multilayer layer having at least three layers, consisting of a second layer of the intermediate layer, a secondary layer and a cooling structure. The upper and lower multilayer layers can be joined together by a DCB process, a DAB process, diffusion welding, a solder joint or by a sintering process, such as silver sintering, or by a further layer, such as a thermally conductive, adhesive insulation layer, such as an epoxy layer or a polyamide layer.

Furthermore, it is also conceivable that the carrier substrate in the sandwich construction has one or more further primary layers for electrical insulation, one or more further secondary layers for stabilising the carrier substrate and/or a plurality of further intermediate elements for heat transport from the component side to the cooling side. The electrical component, for example, is a semiconductor component made of Si, SiC or GaN.

Further advantages and features result from the following description of preferred embodiment of the subject matter of the invention. Individual characteristics of the individual design can be combined with each other within the invention.

In order to ensure sufficient thermal capacity of the intermediate layer, it is further provided that the thickness of the intermediate layer shall be greater, preferably more than twice as great, preferably more than three times as great and more preferably more than five times as great as the combined thickness of the primary layer and the secondary layer. It is also conceivable that the ratio between the layer thickness of the intermediate layer and the total thickness of the carrier substrate has a value between 0.2 and 0.8, preferably a value between 0.3 and 0.7 and more preferably a value between 0.4 and 0.6. The total thickness of the carrier substrate is measured in a direction perpendicular to the primary layer from the conductor paths on the component side to the end of the cooling structure on the cooling side of the carrier substrate. In a particularly compact embodiment, the total thickness of the carrier substrate is less than 8 mm, preferably less than 6 mm and more preferably 4 mm.

It is preferably provided that the conductor paths, the metallic connecting elements, the intermediate layer and/or the cooling structure are produced from material comprising aluminium, molybdenum, tungsten, CuMo, CuW, Invar, Kovar and/or silver. The conductive paths, the metallic connecting elements, the intermediate layer and/or the cooling structure are preferably produced from a material comprising copper. It is also conceivable that the conductive paths, the metallic connecting elements, the intermediate layer and/or the cooling structure are made of composite materials such as, for example, a lamination of the metals mentioned, or as a metal-matrix composite produced by powder metallurgy. Such composites can preferably be made of the metals already mentioned, but for the purpose of CTE adaptation and increased stiffness they are made of metal matrix composites filled with ceramic particles such as Al with Al2O3 and/or SiC and/or Si3N4 or graphite or diamond powder. In order to provide sufficient stability of the carrier substrate, the primary layer and/or the secondary layer is designed such that a modulus of elasticity for the primary layer and/or the secondary layer is greater than the modulus of elasticity of the paths. In addition, it is provided in an advantageous embodiment that the primary layer and optionally the secondary layer are made of a material whose electrical insulation strength is greater than 5 kV/mm, preferably greater than 10 kV/mm and more preferably greater than 20 kV or whose thermal conductivity is greater than 10 W/mK, preferably greater than 20 W/mK and more preferably greater than 60 W/mK.

For example, these are technical ceramics or, in the case of the secondary layer in particular, an organic insulation material filled with heat-conducting materials, such as epoxy resin or polyimide. Al2O3, Si3N4, AlN, BeO, SiC or MgO have proven to be particularly advantageous for forming the primary layer and/or the secondary layer or as fillers for the organic insulation materials. Equally advantageous are Al2O3-based ceramics which, in addition to typical sintering additives for the purpose of conversion amplification, may contain various ZrO2 contents, such as Al2O3 with 9% ZrO2-HPS9 or Al2O3 with 25% ZrO2-HPS25.

According to a further embodiment of the present invention, it is provided that the metallic intermediate layer is designed as a single layer. Single layer means in particular that the metallic intermediate layer is formed in one piece and connects the primary layer and the secondary layer continuously at least in certain areas. In other words: the single-layer intermediate layer borders on one side on the primary layer and on the other side on the secondary layer. The single layer form is advantageous in reducing the effort involved in producing the carrier substrate, as there is no need to stack and connect several layers to form the intermediate layer.

In a particularly advantageous embodiment of the present invention, it is provided that a primary substrate and a secondary substrate are adapted to each other in order to avoid deflection of the carrier substrate with regard to their thermal expansions, in particular with regard to their coefficients of expansion. Here the primary substrate comprises, in addition to the primary layer, a portion of the intermediate layer and the conductive path layer, and the secondary substrate comprises, in addition to the secondary layer, a further portion of the intermediate layer and the cooling structure. Between the primary substrate and the secondary substrate is the intermediate substrate or the middle part of the intermediate layer. The layer thicknesses and/or the materials of the primary substrate and/or the secondary substrate are preferably matched to one another in such a way that the carrier substrate expands equally in the region of the primary layer and in the region of the secondary layer. The result is that thermal stresses that can occur during operation or during the production of the carrier substrate due to temperature can be counteracted in an advantageous manner, thus reducing the probability of a bimetal effect arching the carrier substrate without impairing the electrical insulation properties of the carrier substrate.

Preferably, the carrier substrate is thermomechanically mirror symmetrical to the intermediate layer, i.e. the layer thickness and the materials from which the primary layer and the secondary layer are produced correspond to each other, especially in their thermomechanical behaviour. Alternatively, it is also conceivable that, with the same geometry of primary layer and secondary layer, the material of the secondary layer has a coefficient of expansion which corresponds to that of the material of the primary layer, or is at least comparable in terms of its size in such a way that uniform expansion of the primary layer and that of the secondary layer occurs at the expected temperature distribution. It is also conceivable that in the choice and form of the primary layer and the secondary layer a possible or expected temperature gradient over the carrier substrate is also taken into account.

A cooling structure provided for fluid cooling advantageously adjoins the secondary layer directly on the cooling side as an end of the carrier substrate, the cooling structure being in particular in the form of a ribbed, needle and/or knobbed structure. In particular, the cooling structure is integrated into the carrier substrate. Gases and coolants are conceivable as fluids. By using a coolant that comes into contact with the cooling structure for heat exchange, the heat transported to the cooling side can be removed from the carrier substrate as quickly and efficiently as possible. This further increases the cooling performance advantageously. The use of the metallic intermediate layer also has the synergetic effect of reducing a profile depth of the cooling structure. For example, the cooling structure has an aspect ratio that is less than 8, preferably less than 3 and more preferably less than 1. Another advantage of cooling structures with small aspect ratios is their stability. Furthermore, the cooling structure is preferably coated with a corrosion protection layer for corrosion protection, e.g. with, in particular, a NiP, Ni, SiO2, Al2O3, TiOx, NiAu, NiPdAu layer. This allows the cooling performance of the carrier substrate to be maintained as long as possible over the service life of the carrier substrate, as well as the service life of the entire cooling system and its other components.

According to a further embodiment of the present invention, it is provided that the primary layer has a via and/or the intermediate layer has a contact element to form a further conductive path. This allows the metallic intermediate layer to be used in an advantageous way as an additional conductive path through which currents can be conducted to control individual components, thus reducing or improving parasitic inductive interference fields or interference effects to improve the control of the electrical components and electromagnetic compatibility, and providing a low-inductance carrier substrate.

To electrically connect the intermediate layer with the metallic connecting elements on the primary layer, vias are provided. The vias are designed as through-bores in the primary layer, the through-bore being filled with an electrically conductive filling material, in particular an electrically conductive paste. Preferably, the vias are arranged in a direction perpendicular to a main plane of the primary layer immediately below a metallic terminal element. In order to control the metallic intermediate layer or to apply a voltage to it, it is provided that the metallic intermediate layer has its own contact element or is electrically conductively connected to a contact element on the component side, i.e. on the side of the primary layer facing away from the intermediate element, by the via. It is also conceivable that the electrical components on the component side are not controlled by the via, but by conductive paths which partially or in sections circulate the primary layer and thus establish contact between the component side and the intermediate layer.

The secondary layer is preferably made of ceramic or molybdenum, tungsten or composite materials based on WCu or MoCu. A ceramic secondary layer can be used to provide a particularly stable carrier substrate, wherein the ceramic secondary layer is particularly suitable for electrical insulation if the intermediate layer is used as an additional conductive path. The use of a secondary layer made of ceramic is therefore advantageous if a semiconductor element made of SiC or GaN is intended as an electrical component. In order to reduce manufacturing costs, a secondary layer of molybdenum can also be advantageously used, especially in cases where appropriate insulation is not required.

In a further version of the present invention it is provided that the metallic intermediate layer, the conductive path and/or the cooling structure has etched structures to increase the thermal shock resistance on the side facing the primary layer and/or the secondary layer. This creates openings, i.e. "hidden dimple" structures which are directed towards the primary layer and/or the secondary layer, on the surface of the intermediate layer, the conductive paths and the metallic connecting elements. This advantageously increases the thermal shock resistance of the carrier substrate by up to 10 times. These structures are etched in a punctiform or linear manner. The metallic intermediate layer preferably shows etched structures both on the side facing the primary layer and on the side facing the secondary layer. It is also conceivable that the intermediate layer has at least one etched through-bore or has point-like etched structures arranged along a line, which are not arranged one above the other.

It is preferably provided that the carrier substrate has a housing part which encloses the component side, in particular a housing part which is designed as a cast part, the housing part preferably flushing with the cooling structure arranged on the cooling side. The housing part protects the electrical components on the component side from external influences in an advantageous way. In order to communicate with the electrical components on the carrier substrate, the terminated elements preferably run through the housing part and are available to the user as contacts on the outside of the housing part. The flush finishing of the housing part with the cooling structure proves to be advantageous in that it provides the user the possibility of mounting the carrier substrate on a heat sink, in particular on a solid body used as a heat sink, for example together with other carrier substrates, or of coupling to the cooling structure a shell element or a component for forming a fluid channel, in particular a liquid channel.

In an advantageous embodiment of the present invention, it is provided that the cooling structure has a recess in the metal layer to form an expansion joint in an area adjacent the periphery of the secondary layer. In particular, it is intended that the recess acting as an expansion joint is not covered by the secondary layer. This makes it possible in an advantageous way that a thermal longitudinal expansion of the cooling structure does not cause the formation of mechanical stresses by the recess acting as an expansion joint absorbing the longitudinal expansion of the cooling structure.

Another subject of the invention is a process for producing a carrier substrate. All features and advantages described for the substrate according to the invention can be transferred analogously to the method according to the invention and vice versa.

In concrete terms, the method for producing a carrier substrate suggests that the conductive path, the primary layer, the secondary layer, the intermediate layer and the cooling structure are joined or bonded using a common bonding method, in particular simultaneously in a common method step. In particular, it is provided that the cooling structure will be bonded to the secondary layer during the substrate manufacturing process. Simultaneous joining or bonding of the individual layers allows the deflection of the individual layers to be advantageously avoided during production, as it is usual with the subsequent attaching of the cooling structure. A DCB process, active soldering, brazing or bonding is conceivable as a joining method.

Alternatively, it is also conceivable to manufacture two or more partial substrates separately in a first step using the joining methods already mentioned, such as the primary layer with the conductive path and a part of the metallic intermediate view, as well as the secondary layer with a part of the metallic intermediate layer and the cooler structure. These two individual laminates are joined in a second joining step to the substrate according to the invention by means of common joining methods such as DCB processes, brazing, soft soldering, diffusion welding or a sintering process.

A "DCB process" (Direct Copper Bond Technology) is a process used, for example, to join metal layers or sheets (e.g. copper sheets or foils) together and/or with ceramic or ceramic layers, using metal sheets or copper sheets or metal or copper foils which have on their surface sides a layer or coating (melting layer) of a chemical compound of the metal and a reactive gas, preferably oxygen. In this method, described for example in the U.S. Pat. No. 3,744,120 A or in DE 23 19 854 C2, this layer or coating (melting layer) forms a eutecticum with a melting temperature below that of the metal (e.g. copper), so that by applying the foil to the ceramic and by heating all the layers they can be bonded together, essentially by melting the metal or copper only in the area of the melting layer or oxide layer.

In particular, the DCB process then has the following process steps, for example:
Oxidizing a copper foil to form a homogenous copper oxide layer;
Depositing the copper foil on the ceramic layer;
Heating the composite to a process temperature between approx. 1025 to 1083° C., e.g. to approx. 1071° C.,
Cooling down to room temperature.

An active solder process, e.g. for joining metal layers or metal foils, in particular also copper layers or copper foils with ceramic material, is understood to be a process which is also used in particular for producing metal-ceramic substrates, at a temperature between approx. 650-1000° C. a joint is produced between a metal foil, e.g. copper foil, and a ceramic substrate, e.g. aluminium nitride ceramic, using a brazing alloy which also contains an active metal in addition to a main component, such as copper, silver and/or gold. This active metal, which is for example at least one element of the group Hf, Ti, Zr, Nb, Ce, forms a bond between the solder and the ceramic by chemical reaction, while the bond between the solder and the metal is a metallic brazing bond.

In particular, it is planned that the cooling structure will be bonded or joined within the framework of carrier substrate production. This increases the temperature stability in the interface areas up to the areas of the carrier substrate affected by brazing or the DCB process. The consequence is that the carrier substrate can also be used for components made of semiconductor materials, such as SiC or GaN, which can be operated at temperatures above 200° C., or that there is no limit to the process temperatures, e.g. 400° C., in the downstream assembly and connection processes for module production.

According to another embodiment of the present invention, the carrier substrate is virtually divided into a primary substrate, a secondary substrate and preferably a virtual intermediate layer d15.2 in between. The primary substrate is formed from layers d12, d10 and d15.1 and the secondary substrate from layers d15.3, d20 and d30. When dimensioning, a thermomechanical symmetry between the primary substrate and the secondary substrate is aimed at, i.e. the coefficient of thermal expansion (CTE) of both substrates should preferably be the same or at least similar, for example within a tolerance of +/−20% or preferably +/−10%, preferably +1-5%. This is necessary to reduce possible thermomechanical stresses and the resulting deflection effects. The resulting coefficient of thermal expansion CTE' of a layered composite material is calculated approximately as follows:

$$CTE' = \frac{\sum_{i=1}^{n} CTEi\ Ei\ di}{\sum_{i=1}^{n} Ei\ di}$$

By approximate, the expert understands in particular that the specific coefficient of thermal expansion deviates up to 2 to 4% from the actual coefficient of thermal expansion.

Here it is assumed that the respective partial substrate does not bend or bends only insignificantly. In addition to the respective coefficient of expansion CTEi, the modulus of elasticity $E_i$ and the layer thickness $d_i$ are also included here. The potential bending is avoided by the fact that the metallizations on both sides are thermomechanically the same or similar, which means that e.g. with full-surface metallizations both metal layers are the same or at least similarly thick. The result is that preferably d15.1=d12 and d15.3=d30E (also referred to herein as d30.E), where d30E is an effective layer thickness of the cooler layer which takes into account a possible structuring of the cooling structure.

This applies to the primary substrate:

$$CTE10' = \frac{CTE12\ E12\ d12 + CTE10\ E10\ d10 + CTE15.1\ E15.1\ d15.1}{E12\ d12 + E10\ d10 + E15.1\ d15.1}$$

and for the secondary substrate applies:

$$CTE20' = \frac{CTE15.3\ E15.3\ d15.3 + CTE20\ E20\ d20 + CTE30\ E30\ d30}{E15.3\ d15.3 + E20\ d20 + E30\ d30}$$

where d30E the thermomechanically effective thickness of the cooling structure 30. The thickness d30E depends on the structure of the cooling structure 30, to which the following applies:

$$d30.1 \leq d30E \leq d30$$

If it is not possible to set a complete thermomechanical symmetry (CTE10'=CTE20') when dimensioning the individual components or layers of the carrier substrate, a temperature-dependent bending is to be expected. The described approach serves primarily the optimization of the layer structure in view of a thermomechanical aspect with the goal of realizing carrier substrates as flat as possible.

The choice of the intermediate layer 15 and thus the thickness of the resulting virtual intermediate layer d15.2 depends on the required thermal mass, which significantly defines the temporal behavior of the carrier substrate 1. The layers relevant for the thermal mass are the conductive paths d12, the intermediate layer d15 and the base thickness d30.1 of the cooling structure 30. The thickness of the thermal buffer layers is thus dCu_th=d12+d15+d30.1 is defined. Thickness of thermal buffer layers dCu_th defined as between 1 and 10 mm, preferably between 1.1 and 5 mm, especially preferred between 1.2 and 3 mm.

The optimum bending h is zero in most applications. The amount of bending h is less than 200 µm, preferably less than 100 µm and particularly preferred less than 50 µm.

All above information is to be understood approximately, since the respective structuring, especially of the traces d12 and the cooling structure 30, as well as any boundary effects at the edges of the components cannot be taken into account. The above models are based on a purely elastic behaviour of the materials. The influence of plastic deformation plays a subordinate role here.

According to a further version of the present invention, it is intended that a transverse contraction behaviour is taken into account when determining the coefficient of thermal expansion CTE. In particular, it is provided that the coefficient of thermal expansion as a function of a transverse contraction numbery or vi is determined, preferably according to $$CTE' = \frac{\sum_{i=1}^{n} CTEi \frac{E}{(1-vi)} di}{\sum_{i=1}^{n} \frac{Ei}{(1-vi)} di}$$

This allows the coefficient of thermal expansion to be determined even more precisely.

Figure 1:
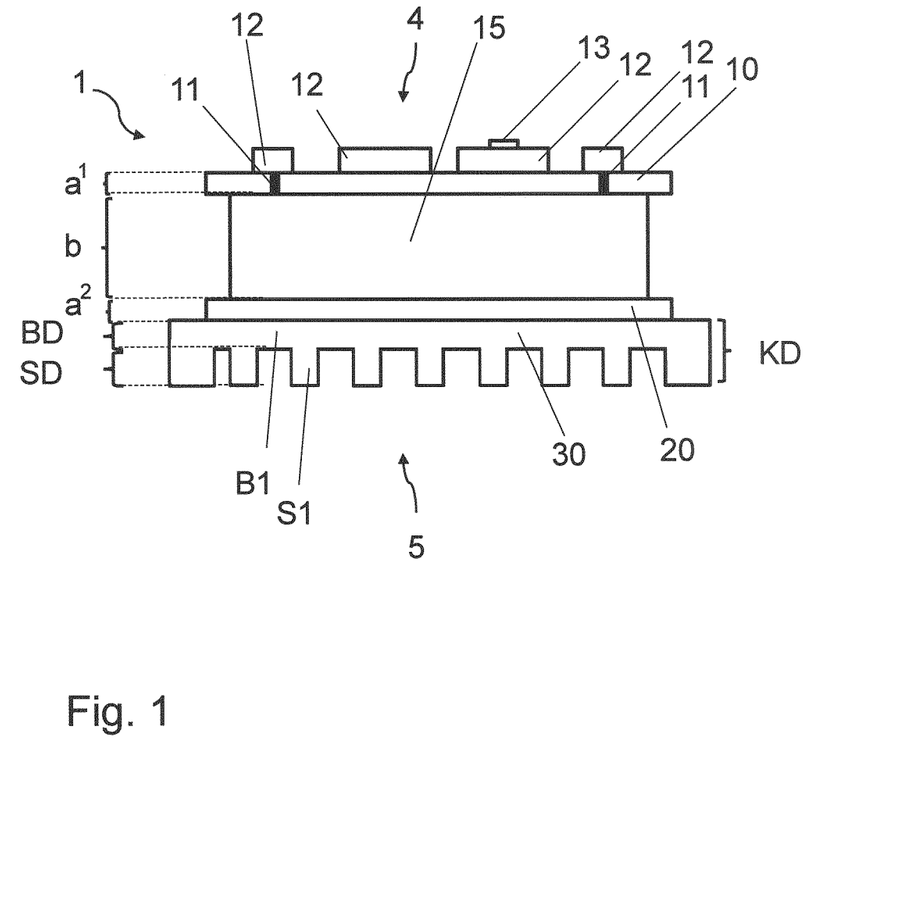
FIG. 1: a carrier substrate for electrical components according to a first exemplary embodiment of the present invention.

FIG. 1 shows schematically a carrier substrate 1 for electrical components 13 according to a first exemplary embodiment of the present invention in a sectional view. This is preferably a carrier substrate which is advantageous for special applications. In particular, the carrier substrate 1 has a component side 4 on which electrically isolated metallic conductive paths 12, for example made of copper or aluminium, are provided for electrical components 13 or modules. By connecting electrical components 13 to the metallic conductive paths 12 and connecting the conductive paths 12, electrical circuits can be implemented for controlling the electrical components 13. In order to counteract heat development occurring during operation and emanating from the electrical components 13, in particular a heat evolution occurring locally in areas with electrical components 13, a cooling structure 30 integrated into the carrier substrate 1 is provided on a cooling side 5 opposite the component side 4. In particular, the cooling structure 30 is a metallic needle or pin structure along which a fluid, preferably a cooling liquid, flows during operation, wherein the heat transferred from the cooling structure 30 to the fluid can be continuously removed in an advantageous manner.

To provide electrical insulation between the individual conductive paths 12 on component side 4, a ceramic primary layer 10 is provided on component side 4. The primary layer 10 is plate-shaped. A secondary layer 20 is provided in addition to the primary layer 10 to provide sufficient stability and rigidity. In this, it is provided that the material from which the primary layer 10 and the secondary layer 20 are made has a modulus of elasticity greater than that of the material from which the conductors are made. In order to counteract a bi-metal effect occurring in the event of temperature changes and arching the carrier substrate 1, it is further preferably provided that the carrier substrate 1 is constructed mirror-symmetrically or essentially mirror-symmetrically thermomechanically from a thermal point with respect to a metallic intermediate layer 15 which is arranged between the primary layer 10 and the secondary layer 20.

For example, carrier substrate 1 is mirror-symmetrical in terms of its layer sequence, i.e. the number and type of layers, the respective layer thicknesses and/or the materials used for the layers, or the individual layers are adapted to each other in this respect. In particular, the secondary layer 20 is made of a material whose coefficient of expansion preferably corresponds to that of the material from which the primary layer 10 is produced from. It is conceivable that the secondary layer 20 is made of ceramic, molybdenum, tungsten or composite materials based on WCu or MoCu. In the example shown, the secondary layer 20 is produced from ceramic. It is also conceivable that the coefficients of expansion of the primary substrate 10' and the secondary substrate 20' match within a specified tolerance range. Preferably the coefficients of expansion of the primary substrate 10' and the secondary substrate 20' differ less than +/−20%, preferably less than +/−10%. The form of the carrier substrate 1 with the primary substrate 10' and the secondary substrate 20' not only allows the stiffness of the carrier substrate 1 to be increased in an advantageous manner by an appropriate selection of the materials with regard to the coefficients of expansion for the primary substrate 10' and the secondary substrate 20', but also counteracts any thermal stresses which occur during the production of the carrier substrate 1 or during its conventional operation.

In order to improve heat transfer from the component side 4 to the cooling side 5, it is also planned that a multi-layer or single-layer metallic intermediate layer 15 is arranged between the primary layer 10 and the secondary layer 20. The metallic intermediate layer 15 is thicker than the primary layer 10 and/or the secondary layer 20, in particular thicker than the sum of the primary layer thickness and the secondary layer thickness. Preferably, the intermediate layer 15 is greater than twice, preferably greater than three times or particularly preferred greater than five times the sum of the layer thicknesses of the primary layer 10 and the secondary layer 20. As a result, a thermal mass is formed in the form of the intermediate layer 15.

The arrangement of the metallic intermediate layer 15 acting as thermal mass between the primary layer 10 and the secondary layer 20 proves to be advantageous insofar as the intermediate layer 15 serves as intermediate storage, which proves to be particularly advantageous in switch-on and/or overload situations. This allows higher short-term peak powers to be absorbed by the intermediate layer 15 by the heat capacity and, in the event of a failure of the heat exchanger or heat sink connected to the cooling side, the period of time is increased during which the failure can be reacted to without causing permanent damage to the carrier substrate 1. Furthermore, the secondary layer 20 provides sufficient stability to reduce the layer thickness of the primary layer 10. This has a particularly advantageous effect on the thermal resistance due to the immediate proximity of the primary layer 10 to the heat-generating components 13 on the carrier substrate 1. In addition, the heat origin from the local heat sources on component side 4 is distributed more extensively in the intermediate layer 15, since the thickness of the intermediate layer 15 permits sufficient spreading or undirected transferring of the heat over a comparatively large distance, which also has an advantageous effect on the thermal resistance. Furthermore, the comparatively large thickness of the intermediate layer 15 proves to be advantageous in that it further increases the stiffness of the carrier substrate 1 and thus counteracts deflection caused by different coefficients of expansion and external stresses and forces such as those caused by the pressure of the cooling liquid on the substrate.

In order to reduce parasitic induction effects occurring on carrier substrate 1 during operation, it is also preferable to use the metallic intermediate layer 15 as an additional conductive path. A through-connection 11, i.e. a via, is provided in the primary layer 10, via which a current can be applied to the metallic intermediate layer 15 or via which an electrically conductive connection between the metallic intermediate layer 10 and a metallic terminal element is realised on the primary layer 10. In order to ensure sufficient electrical insulation, the secondary layer 20 of carrier substrates 1 with the via 11 is in particular an electrically insulating layer, e.g. another ceramic layer. In the embodiment shown in FIG. 1, contact elements are provided on the component side, i.e. on the primary layer, which can be used to apply a voltage to the metallic intermediate layer 15.

In the embodiment shown it is intended that the interlayer thickness b is between 1.1 and 10 times, preferably between 1.2 and 5 times, more preferably between 1.3 and 3 times or even substantially 1.5 times as thick as the primary layer thickness a1 and/or the secondary layer thickness a2. For example, the interlayer thickness b assumes a value between 1 mm and 10 mm, preferably between 1 mm and 5 mm, more preferably between 1.5 mm and 5 mm or even a value of essentially 1.5 mm. Other interlayer thicknesses, especially larger thicknesses, are also possible.

Alternatively, it is provided that the interlayer thickness b is between 2.5 and 100 times, preferably between 3.5 and 50 times, more preferably between 10 and 25 times or even substantially 2.0 times as thick as the primary layer thickness a1 and/or the secondary layer thickness a2. For example, the interlayer thickness b is a value between 1 mm and 10 mm, preferably between 1 mm and 5 mm, more preferably between 1.5 mm and 5 mm, or even a value of essentially 3 mm.

Furthermore, it is preferred that the primary layer thickness a1 essentially corresponds to the secondary layer thickness a2. Alternatively, it is conceivable that the secondary layer thickness a2 is essentially 1.5 to 5 times, preferably 1.3 to 2.5 times and more preferably 1.1 to 2 times as thick as the primary layer thickness a1. Furthermore, the thickness ratios can be structured such that a2=0.5-2.0 a1, preferably a2=0.7-1.6 a1, especially preferred a2=0.8-1.2 a1.

In other words, the thickness ratios can be structured such that a2=0.5 a1 to 2.0 a1, preferably a2=0.7 a1 to 1.6 a1, especially preferred a2=0.8 a1 to 1.2 a1.

Furthermore, it is provided that the cooling structure 30 has a base body region B1 and a rip region S1. The rip region Si is preferably formed by rips or fins protruding perpendicularly from the base body region B1, while the base body region B1 in particular forms a solid region or unstructured body. Preferably the base body region B1 and the rip region S1 are formed as one piece. A ratio between a rip region thickness SD and a base body thickness BD is a value between 1.2 and 6, preferably between 1.4 and 3 and more preferably between 1.6 and 2.5. Furthermore, it is provided that a cooling structure thickness, in particular an effective cooling structure thickness d30.E, is 0.03 to 1 times, preferably 0.1 to 0.5 and especially preferably 0.15 to 0.3 times, the size of the interlayer thickness b.

Figure 2A:
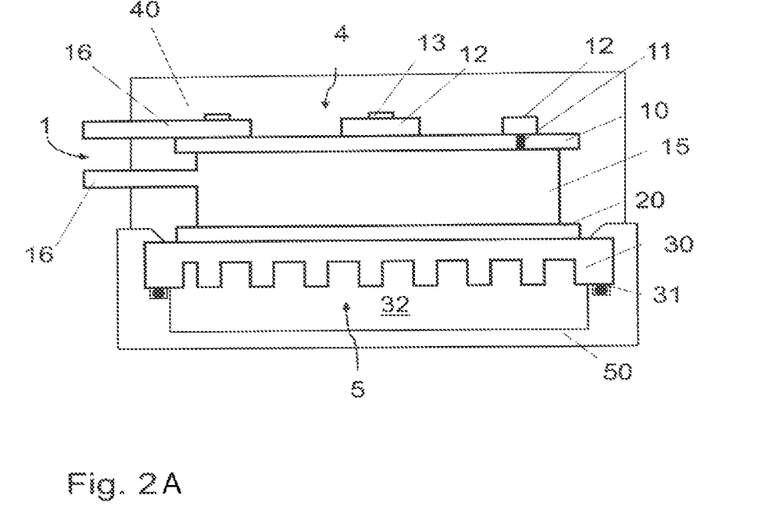
FIG. 2A a carrier substrate for electrical components according to a second exemplary embodiment of the present invention.
Figure 2B:
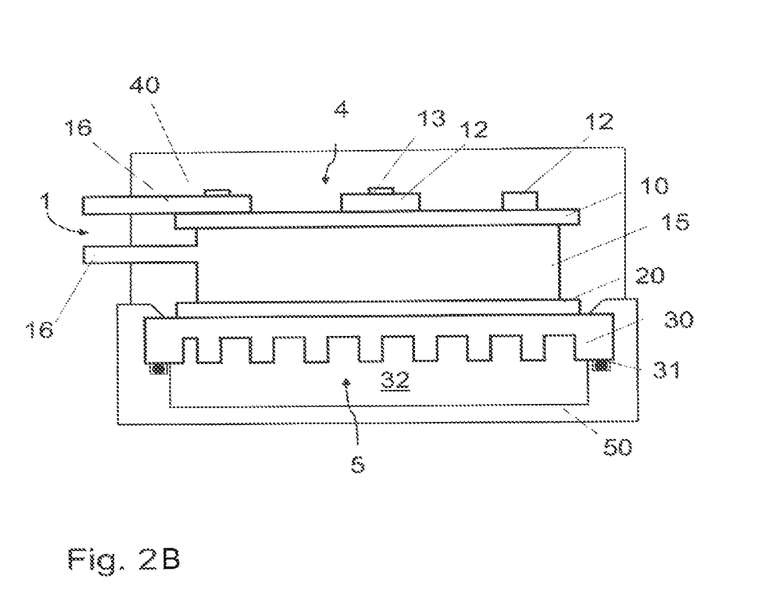
FIG. 2B a carrier substrate for electrical components according to an exemplary embodiment of the present invention.

FIG. 2A schematically shows a carrier substrate 1 for electrical components 13 according to a second exemplary embodiment of the present invention in a sectional view. The carrier substrate 1 is essentially the same as in FIG. 1. In contrast to the embodiment shown in FIG. 1, a contact element 16 is provided on the intermediate layer 15. This contact element 16 allows direct contacting of the intermediate element 15 in order to apply a voltage to it in order to reduce parasitic inductive effects on the carrier substrate 1 and thus to induce a current in the intermediate layer 15. Furthermore, it is intended that the carrier substrate 1 is surrounded by a housing part 40 on component side 4. In particular, this is a cast housing part 40. A contact element 16 is also provided to contact the conductive paths 12 on the primary layer 10. In order to apply a voltage to the conductive path 12 on the primary layer 10 and the intermediate layer 15, it is provided that the contact elements 16 of the intermediate layer 15 and the top of the primary layer 10 are guided through the housing part 40. The contact elements 16 protrude from the housing part 40, preferably on the same side of a housing part wall. FIG. 2B schematically shows a carrier substrate in which the primary layer extends over the entire component side of the carrier substrate.

In the embodiment shown, the carrier substrate 1 comprises a shell element 50, in particular a plastic-containing shell element 50, which is preferably clipped to the cooling structure 30, to form a fluid channel 32 in which, in operation, for example, a cooling liquid is transported along a flow direction. To seal the connection between cooling structure 30 and shell element 50, a sealing element 31 is provided, which is embedded in a corresponding recess in shell element 50. The needles or pins of the cooling structure 30 arranged on the cooling side 5 of the carrier substrate 1 protrude into the fluid channel 32 filled with the cooling liquid during operation.

Figure 3A:
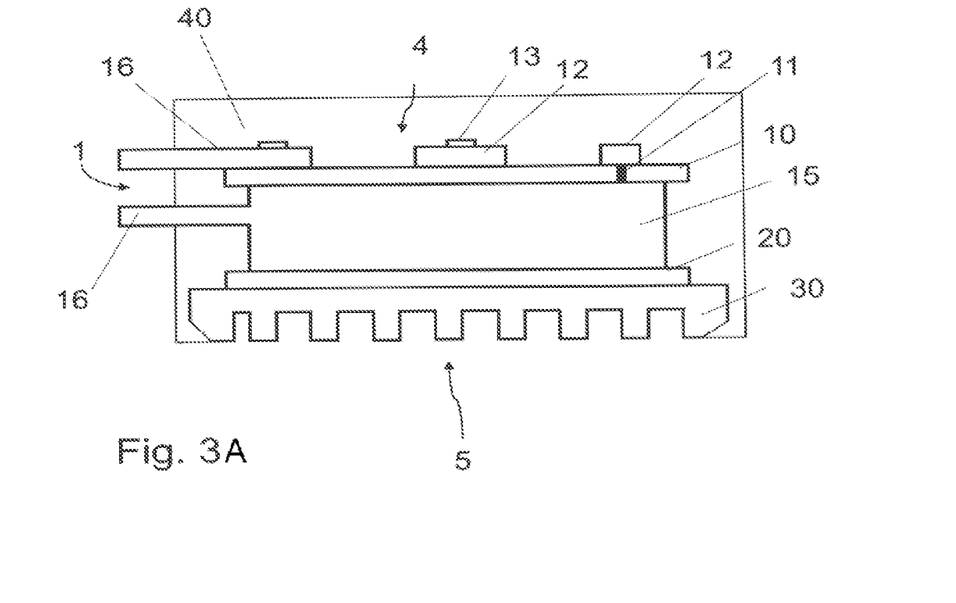
FIG. 3A a carrier substrate for electrical components according to a third exemplary embodiment of the present invention.
Figure 3B:
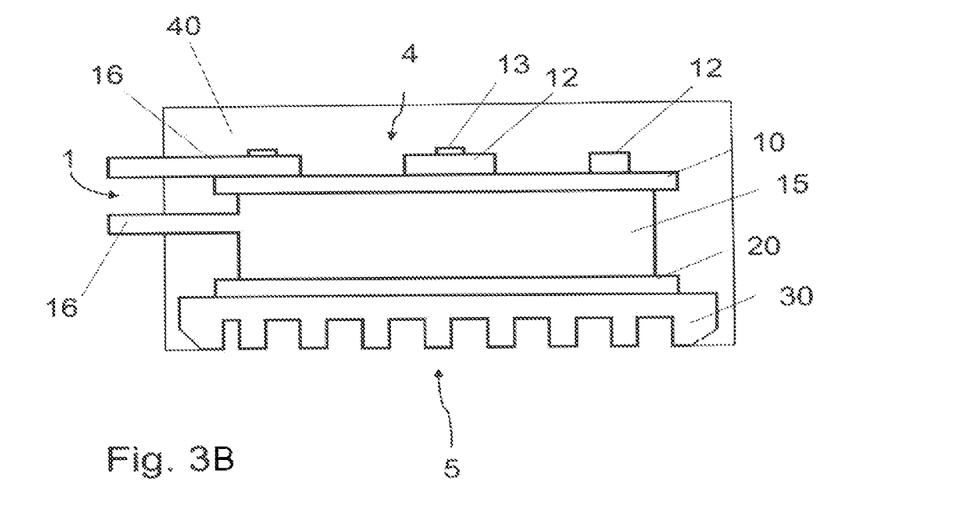
FIG. 3B a carrier substrate for electrical components according to an exemplary embodiment of the present invention.

FIG. 3A schematically shows a carrier substrate 1 for electrical components 13 according to a third exemplary embodiment of the present invention in a sectional view. The carrier substrate 1 is essentially the same as in FIG. 2A. In addition to the features of the carrier substrate 1 from FIG. 2A, it is provided here that the cast housing part 40 flushes at the cooling side 5 with the cooling structure 30. This allows in an advantageous way to simply place or fasten the carrier substrate 1 on a cooling structure, for example on a shell element 50. This allows the carrier substrate 1 to be used particularly flexibly. For this purpose it is in particular provided that the cooling structure 30 in one or more edge regions has an undercut or a recess so that the cooling structure 30 cooperates positively with the housing part 40 along a direction extending perpendicularly to the primary layer 10. FIG. 3B schematically shows a carrier substrate in which the primary layer extends over the entire component side of the carrier substrate.

Figure 4:
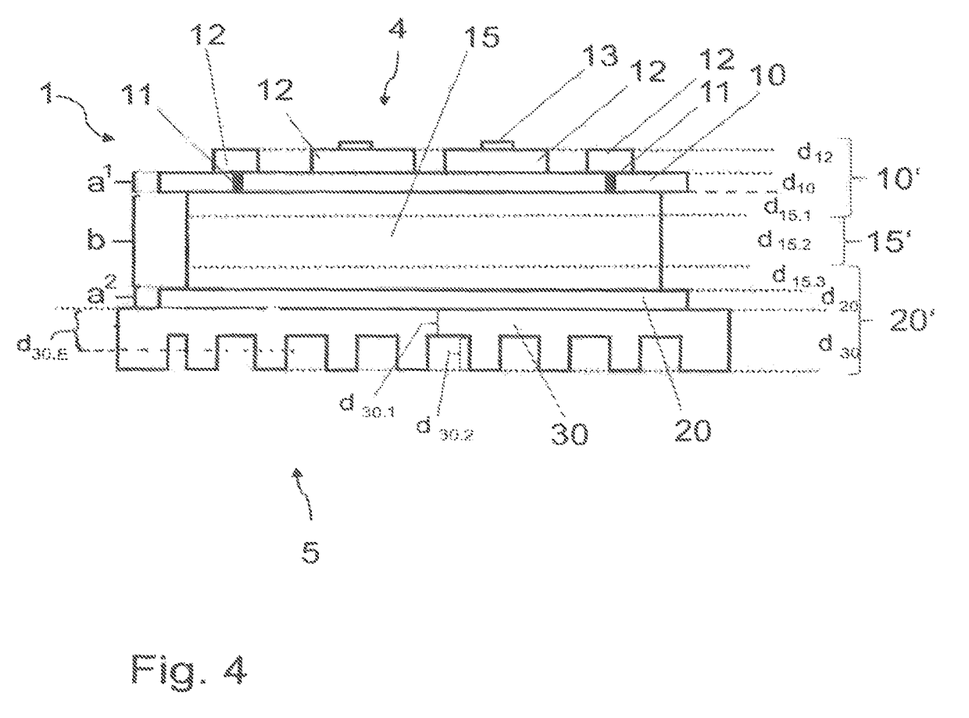
FIG. 4 a carrier substrate for electrical components according to a fourth exemplary embodiment of the present invention.

FIG. 4 shows a carrier substrate for electrical components according to a fourth exemplary embodiment of the present invention. In order to dimension the primary layer, the secondary layer and the metallic intermediate layer, it is provided here that the carrier substrate 1 is virtually divided into a primary substrate 10', a secondary substrate 20 and preferably into a virtual intermediate layer 15' located in between. The primary substrate 10' is formed from layers d12, d10 and d15.1 and the secondary substrate from layers d15.3, d20 and d30. When dimensioning, a thermomechanical symmetry between the primary substrate and the secondary substrate is aimed at, i.e. the coefficient of thermal expansion (CTE) of the primary substrate 10' and the secondary substrate 20' should preferably be the same or at least similar, for example within a tolerance of +/−20 or preferably +/−10%. This is necessary to reduce possible thermomechanical stresses and the resulting deflection effects. The resulting coefficient of thermal expansion CTE' of a layered composite material is calculated approximately as follows:

$$CTE' = \frac{\sum_{i=1}^{n} CTEi\ Ei\ di}{\sum_{i=1}^{n} Ei\ di}$$

Here it is assumed that the respective partial substrate does not bend or bends only insignificantly. This possible bending is avoided by the fact that the metallizations on both sides are thermomechanically the same or similar, which means, for example, that both metal layers are the same or at least similarly thick in the case of full-surface metallizations. The result is that preferably d15.1=d12 and d15.3=d30E.

This applies to the primary substrate:

$$CTE10' = \frac{CTE12\ E12\ d12 + CTE10\ E10\ d10 + CTE15.1\ E15.1\ d15.1}{E12\ d12 + E10\ d10 + E15.1\ d15.1}$$

and to the secondary substrate applies:

$$CTE20' = \frac{CTE15.3\ E15.3\ d15.3 + CTE20\ E20\ d20 + CTE30\ E30\ d30}{E15.3\ d15.3 + E20\ d20 + E30\ d30}$$

Where d30E is the thermomechanically effective thickness of the cooling structure 30. The thickness d30E depends on the structure of the cooling structure 30, to which the following applies:

$$d30.1 \leq d30E \leq d30$$

If it is not possible to set a complete thermomechanical symmetry (CTE10'=CTE20') when dimensioning the individual components or layers of carrier substrate 1, a temperature-dependent bending is to be expected. The described approach serves primarily the optimization of the layer structure in thermomechanical regard with the goal to realize carrier substrates 1 as flat as possible.

The choice of the intermediate layer 15 and, thus, of the thickness d15.2 of the resulting virtual intermediate layer, i.e. the intermediate substrate 15', depends on the required thermal mass, which significantly defines the temporal behaviour of the carrier substrate 1. The relevant layers or layer thicknesses for the thermal mass are those of the conductive path d12, the intermediate layer d15 and the base thickness d30.1 of the cooling structure 30. The thickness of the thermal buffer layers is therefore defined as dCu_th=d12+d15+d30.1. The thickness of thermal buffer layers dCu_th is between 1 and 10 mm, preferably between 1.1 and 5 mm, particularly preferred between 1.2 and 3 mm. The optimum bending h is zero in most applications. The amount of bending h is less than 200 μm, preferably less than 100 μm and particularly preferred less than 50 μm. All above dimensions are to be understood approximately, since the respective structuring, especially of the traces d12 and the cooling structure 30, as well as any boundary effects at the edges of the components cannot be taken into account. The above models are based on a purely elastic behaviour of the materials. The influence of plastic deformation plays a subordinate role here.

Figure 5:
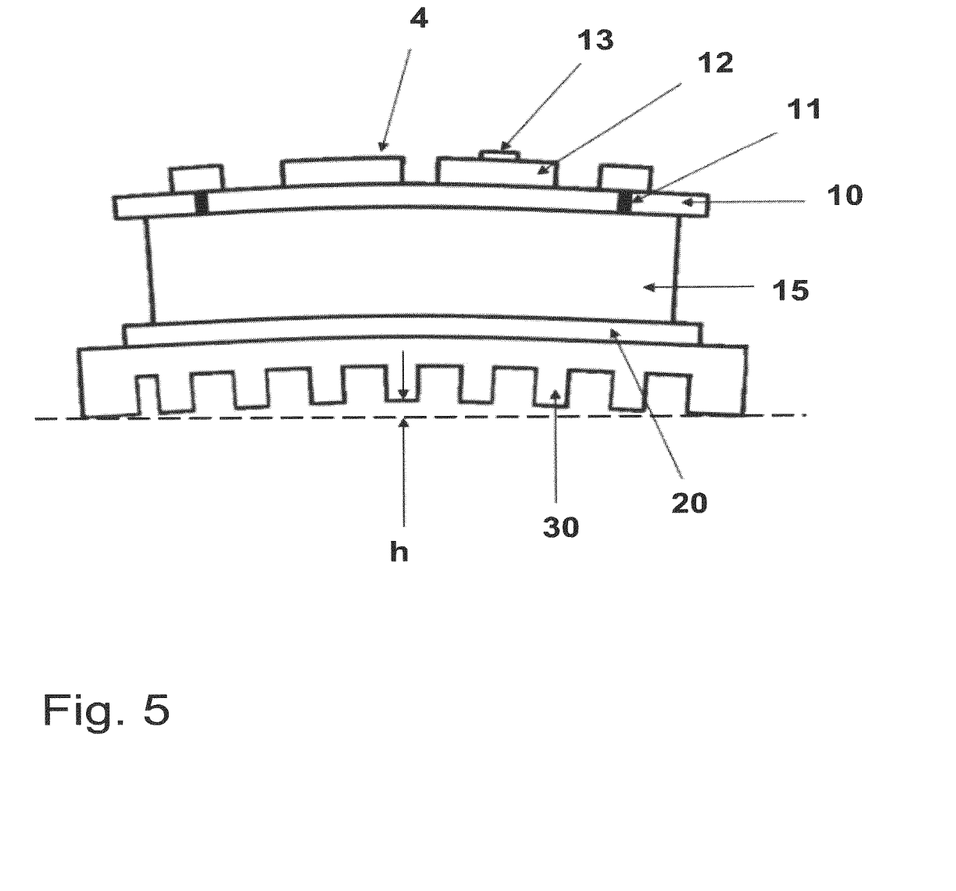
FIG. 5 the carrier substrate of FIG. 4 in a bent condition.

FIG. 5 shows the carrier substrate 1 for electrical components 13 according to the fourth exemplary embodiment of the present invention. The carrier substrate 1 is represented in a bent state in which the carrier substrate 1 has a bend h.

Figure 6:
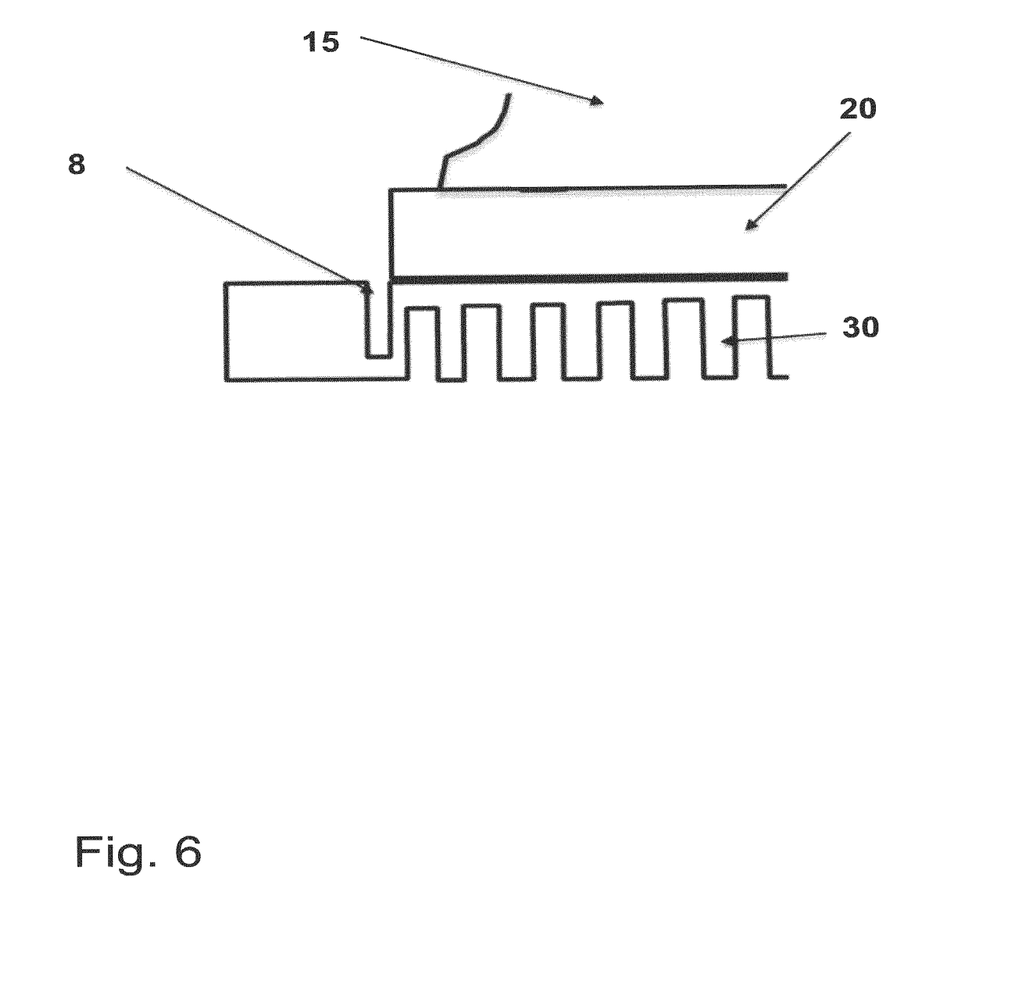
FIG. 6 a cooling structure for a carrier substrate according to a fifth form of the present invention.

FIG. 6 shows a cooling structure 30 for a carrier substrate 1 according to a fifth embodiment of the present invention. Here it is provided that a recess 8 is arranged on the metal layer designed as a cooling structure 30 the side facing the secondary layer 20 and/or the primary layer 10. In particular, it is provided that the recess 8 is arranged offset with respect to the primary layer 10 and/or secondary layer 20 in a direction extending parallel to the main extension plane, wherein the cooling structure 30 projects with respect to the primary layer 10 and/or secondary layer 20. In particular, it is intended that the recess is formed as an expansion joint to prevent the thermal expansion of the cooling structure 30 from causing mechanical stresses in the entire carrier substrate 1.

REFERENCE CHARACTER LIST 1 carrier substrate
4 component side
5 cooling side
8 recess
10 primary layer
10' primary substrate
11 via
12 conductive path
13 electrical component
16 contact element
15 intermediate layer
15' intermediate substrate
20 secondary layer
20' secondary substrate
30 cooling structure -continued

| | |
|---|---|
| 31 | sealing element |
| 32 | fluid channel |
| 40 | housing part |
| 50 | shell element |
| a1 | primary layer thickness |
| a2 | secondary layer thickness |
| KD | cooling structure thickness |
| DB | base body thickness |
| SD | rip region thickness |
| B | interlayer thickness |
| H | bend |
| d12, d10 and d15.1 | Layer thickness contributions to the primary substrate |
| d15.3, d20 and d30 | Layer thickness contributions to the secondary substrate |
| d15.2 | layer thickness of the intermediate substrate |
| d30.E | effective layer thickness of the cooling structure |
| d30.1, d30.2 | coating thickness contributions to the cooling structure |

The invention claimed is:

1. A carrier substrate (1) for electrical components (13), the carrier substrate (1) having a component side (4) including conductive paths (12) and a cooling side (5), which is opposite the component side (4) and has a cooling structure (30), the carrier substrate (1) has a housing part (40) encasing the component side (4) of the carrier substrate (1), the conductive paths (12) have a first contact element (16) to form a conductive path that extends through and out of the housing part (40), the carrier substrate (1) comprising, for electrical insulation of the electrical components (13), a primary layer (10) which faces the component side (4) and is produced from ceramic, and, for stiffening the carrier substrate (1), a secondary layer (20) which faces the cooling side (5) and is produced from ceramic, molybdenum, tungsten or a composite materials based on WCu or MoCu, a metallic intermediate layer (15) being arranged between the primary layer (10) and the secondary layer (20) for heat transfer from the component side (4) to the cooling side (5), the carrier substrate (1) forming a sandwich construction, in which the primary layer (10) and the secondary layer (20) are separated by the metallic intermediate layer (15), the intermediate layer (15) has a second contact element (16) to form a further conductive path that extends through and out of the housing part (40), the metallic intermediate layer (15) being thicker than each of the primary layer (10) and the secondary layer (20), wherein the intermediate layer (15) is thicker than 1 mm, wherein an effective thickness (d30.E) of the cooling structure (30) is 0.1 to 0.5 times as large as a thickness (b) of the metallic intermediate layer (15), the effective thickness (d30.E) being an average thickness of the cooling structure (30), wherein the carrier substrate (1) is virtually divided into a primary substrate (10') and a secondary substrate (20'), the secondary substrate (20') includes the cooling structure (30), wherein a coefficient of thermal expansion of both of the virtual primary (10') and secondary (20') substrates be a same or at least the same within a tolerance of +/−10%, wherein the primary layer (10) extends over an entirety of the component side (4) of the carrier substrate (1), and wherein the carrier substrate (1) has a housing part (40) encasing the component side (4) of the carrier substrate (1).

2. The carrier substrate (1) according to claim 1, wherein the metallic intermediate layer (15) is between 2.5 and 100 times as thick as the primary layer (10) and between 2.5 and 100 times as thick as the secondary layer (20).

3. The carrier substrate (1) according to claim 1, wherein the metallic intermediate layer (15) is between 1.4 mm and 10 mm thick.

4. The carrier substrate (1) according to claim 1, wherein the cooling structure (30) comprises a base body region (B1) and a rip region (S1), and wherein a ratio (SD/BD) between a thickness (SD) of the rip region (S1) and a thickness (BD) of the base body region (B1) has a value between 1.2 to 3.

5. The carrier substrate (1) according to claim 4, wherein the ratio (SD/BD) has the value between 1.6 to 2.5.

6. The carrier substrate (1) according to claim 1, wherein the metallic intermediate layer (15) is formed as a single layer.

7. The carrier substrate (1) according to claim 1, wherein the cooling structure (30) is configured for fluid cooling, and at an end of the carrier substrate (1) on the cooling side (5), the cooling structure (30) is directly adjacent to the secondary layer (20).

8. The carrier substrate (1) according to claim 1, the metallic intermediate layer (15), the conductive paths (12), a contact element (16), and/or the cooling structure (30) have etched structures on aside facing the primary layer (10) or a side facing the secondary layer (20) for increasing a thermal shock resistance of the carrier substrate (1).

9. The carrier substrate (1) according to claim 1, wherein the housing part (40) is a cast part and ends flush with the cooling structure (30) arranged on the cooling side (5).

10. A method for producing a carrier substrate (1) according to claim 1, wherein the primary layer (10), the secondary layer (20), the intermediate layer (15) and the cooling structure (30) are joined by a common joining method.

11. The method for producing the carrier substrate (1) according to claim 10, wherein the primary layer (10), the secondary layer (20), the intermediate layer (15), the cooling structure (30), and the conductive paths (12) are joined by the common joining method simultaneously in a common method step.

12. A carrier substrate (1) for electrical components (13), the carrier substrate (1) having a component side (4) including conductive paths (12) and a cooling side (5), which is opposite the component side (4) and has a cooling structure (30), the carrier substrate (1) has a housing part (40) encasing the component side (4) of the carrier substrate (1), the conductive paths (12) have a first contact element (16) to form a conductive path that extends through and out of the housing part (40), the carrier substrate (1) comprising, for electrical insulation of the electrical components (13), a primary layer (10) which faces the component side (4) and is produced from ceramic, and, for stiffening the carrier substrate (1), a secondary layer (20) which faces the cooling side (5) and is produced from ceramic, molybdenum, tungsten or a composite materials based on WCu or MoCu, a metallic intermediate layer (15) being arranged between the primary layer (10) and the secondary layer (20) for heat transfer from the component side (4) to the cooling side (5), the carrier substrate (1) forming a sandwich construction, in which the primary layer (10) and the secondary layer (20) are separated by the metallic intermediate layer (15), the intermediate layer (15) has a second contact element (16) to form a further conductive path that extends through and out of the housing part (40), the metallic intermediate layer (15) being thicker than each of the primary layer (10) and the secondary layer (20), wherein the intermediate layer (15) is thicker than 1 mm, wherein an effective thickness (d30.E) of the cooling structure (30) is 0.1 to 0.5 times as large as a thickness (b) of the metallic intermediate layer (15), the effective thickness (d30.E) being an average thickness of the cooling structure (30), wherein the cooling structure (30) comprises a base body region (B1) and a rip region (S1), wherein a ratio (SD/BD) between a thickness (SD) of the rip region (S1) and a thickness (BD) of the base body region (B1) has a value between 1.6 to 3, and wherein the primary layer (10) extends over an entirety of the component side (4) of the carrier substrate (1).

13. The carrier substrate (1) according to claim 12, wherein the ratio (SD/BD) has the value between 1.6 to 2.5.

\* \* \* \* \*